(12) United States Patent
Kushida et al.

(10) Patent No.: US 7,135,791 B2
(45) Date of Patent: Nov. 14, 2006

(54) ELECTRIC TIGHTENING DEVICE

(75) Inventors: Toshihiko Kushida, Osaka (JP); Yukio Torigai, Sakai (JP)

(73) Assignee: Maeda Metal industries, Ltd., Osaka (JP)

( * ) Notice: Subject to any disclaimer, the term of this patent is extended or adjusted under 35 U.S.C. 154(b) by 0 days.

(21) Appl. No.: 11/286,759

(22) Filed: Nov. 23, 2005

(65) Prior Publication Data
US 2006/0113934 A1    Jun. 1, 2006

(30) Foreign Application Priority Data
Dec. 1, 2004    (JP) .............................. 2004-348019

(51) Int. Cl.
*B25B 21/00* (2006.01)
*H02J 7/00* (2006.01)

(52) U.S. Cl. .................. 307/150; 388/937; 320/134; 320/148; 320/149

(58) Field of Classification Search ............... 388/937; 307/149–150; 320/107, 112–115, 127, 134, 320/149, 152
See application file for complete search history.

(56) References Cited

U.S. PATENT DOCUMENTS

| | | | | |
|---|---|---|---|---|
| 4,714,868 A | * | 12/1987 | Maruyama et al. | ......... 320/101 |
| 5,144,248 A | * | 9/1992 | Alexandres et al. | ........ 324/428 |
| 5,357,203 A | * | 10/1994 | Landau et al. | .............. 324/427 |
| 5,451,881 A | * | 9/1995 | Finger | ......................... 324/433 |
| 6,765,317 B1 | * | 7/2004 | Chu | ........................... 307/150 |
| 6,771,043 B1 | * | 8/2004 | Matsunaga et al. | ......... 320/114 |
| 6,847,191 B1 | * | 1/2005 | Wang | ......................... 320/114 |

FOREIGN PATENT DOCUMENTS

JP    A-2000-117649    4/2000

* cited by examiner

*Primary Examiner*—Bentsu Ro
(74) *Attorney, Agent, or Firm*—Arnold B. Silverman; Eckert Seamans Cherin & Mellott, LLC

(57) ABSTRACT

A controller compares a minimum value of power source voltage which decreases in association with starting current generated upon start of a motor with a threshold value in a storing unit. When the minimum value is less than the threshold value, the controller notifies of shortage of the power source terminal voltage, and stops the motor. The controller also compares a value obtained by integrating the power source voltage which decreases in association with starting current generated upon start of the motor for only predetermined time with the threshold value in the storing unit, when the integral value is less than the threshold value, notifies of shortage of the power source terminal voltage, and stops the motor.

2 Claims, 7 Drawing Sheets

ELECTRIC TIGHTENING DEVICE

BACKGROUND OF THE INVENTION

1. Field of the Invention

The present invention relates to an electric tightening device for tightening a bolt to a member as an object of tightening such as a steel frame.

2. Background of the Invention

Figure 7:
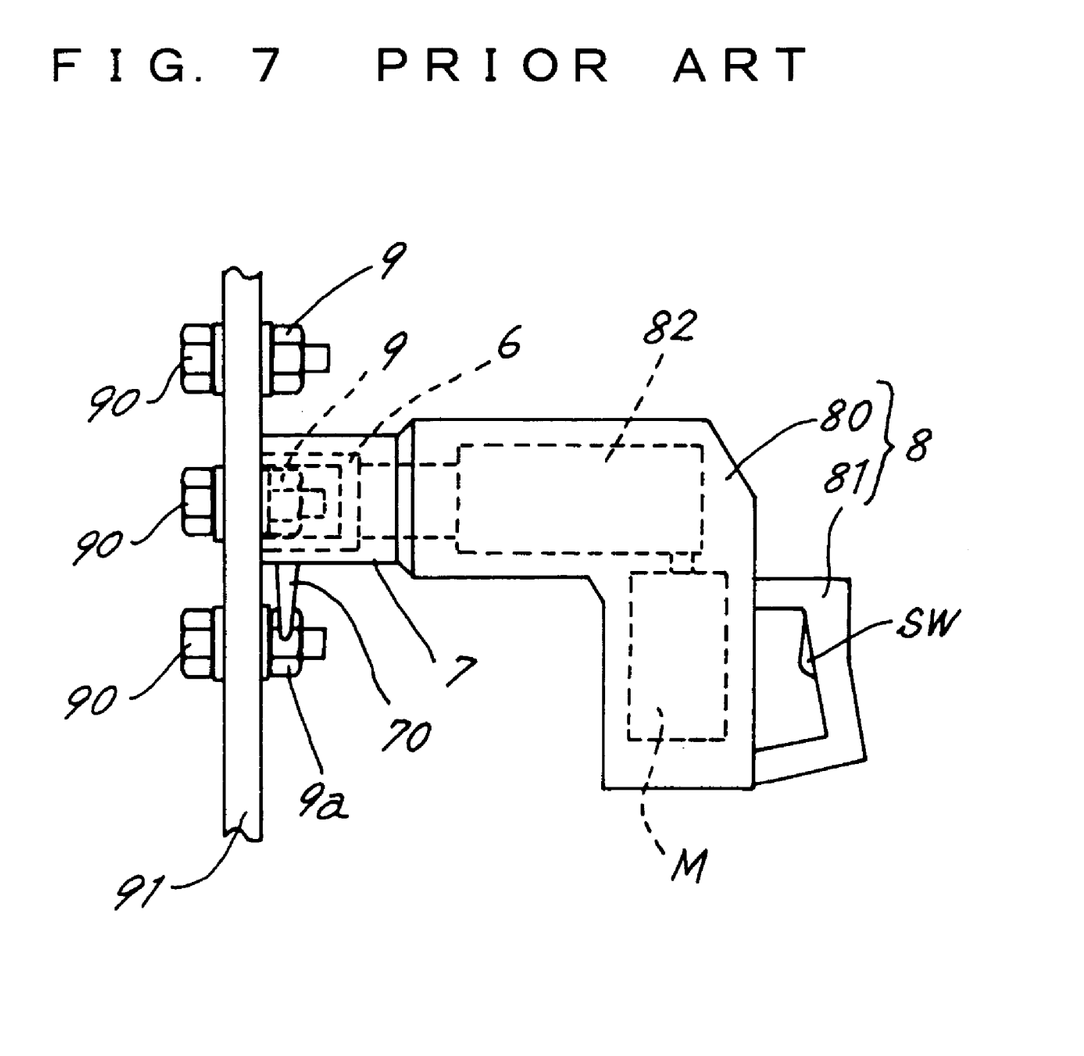
FIG. 7 is a side view of a conventional electric tightening device.

FIG. 7 is a side view showing bolts 90 and nuts 9 for building or bridge temporarily attached in a plurality of positions in a member 91 as an object of tightening such as a steel frame and a conventional electric tightening device 8 for tightening the nuts 9 to the bolts 90 one by one (refer to Japanese Patent Laid-Open No. 2000-117649). The electric tightening device 8 is constructed by housing a motor M and a planetary gear mechanism 82 including a reduction gear in a tightening device body 80 and coupling an outer socket 7 to the tip of the tightening device body 80. A handle 81 of the tightening device body 80 is provided with a switch SW for starting/stopping operation.

The outer socket 7 integrally has a projected reaction force receiving arm 70 on its outer periphery and has therein an inner socket 6 which engages with the nut 9 and rotates the nut 9. In the planetary gear mechanism 82, the rotary shaft of the motor M is coupled to a center gear (sun gear), the inner socket 6 is coupled to a plurality of planetary gears engaged with the center gear, and the outer socket 7 is coupled to a revolution gear engaged with the planetary gears. When the inner socket 6 is engaged with the nut 9 and the motor M is rotated by turning on the power source, the reaction force receiving arm 70 is rotated by the planetary gear mechanism 82. From the time point when the reaction force receiving arm 70 comes into contact with the neighboring nut 9a, the inner socket 6 rotates and the nut 9 accordingly rotates, thereby tightening the nut 9.

Electric power is fed to the motor M from a battery (not shown) as a power source. When the residual quantity of the battery is insufficient, it is indicated by a pilot lamp or the like. The power source is not limited to a battery but may be a DC or AC power source from the outside. In the following, the case where a battery is used as a power source will be described. In the case of the AC power source, "shortage of the residual quantity of the battery" corresponds to "insufficient capacity of the AC power source or an electric circuit".

There are various means for determining whether the residual quantity of the battery is insufficient or not. When the determination is made by detecting only a terminal voltage of a battery before the motor M is started, the following problem occurs.

Specifically, even when the terminal voltage before the motor M is started is sufficient, for example, in a deteriorated battery, a voltage drop of the battery terminal voltage upon start of the motor M is larger than that in a less-deteriorated battery.

Therefore, in the deteriorated battery, even if the battery terminal voltage before the motor M is started is a voltage which can start the motor M, when the nut 9 is tightened and a load increases, the battery terminal voltage largely drops, malfunction occurs during operation of the motor M, and there is the possibility that the nut 9 cannot be tightened properly.

There is another electric tightening device in which battery temperature measuring means, means for storing the residual quantity of a battery and, further, means for entering a discharge efficiency value preliminarily obtained by experiments into a data table and computing an exact battery residual quantity on the basis of a value read from the data table are assembled. However, the electric tightening device has a problem that the cost is too high.

An object of the present invention is to accurately notify the operator of whether a nut can be tightened or not with a simple configuration that does not include the battery temperature measuring means, a data table, and the like.

SUMMARY OF THE INVENTION

In an electric tightening device of the present invention, a controller 1 compares a minimum value of a power source voltage generated on start of a motor M with a threshold value in a storing unit 10 and, when the minimum value is less than the threshold value, notifies of shortage of the power source terminal voltage.

Alternately, the controller 1 compares a maximum value of starting current generated on start of the motor M with a threshold value in the storing unit 10 and, when the maximum value is less than the threshold value, notifies of shortage of the power source terminal voltage.

Alternately, the controller 1 compares a value obtained by integrating a power source voltage which decreases in association with starting current generated on start of the motor M for only predetermined time with the threshold value in the storing unit 10 and, when the integral value is less than the threshold value, notifies of shortage of the power source terminal voltage.

Alternately, the controller 1 compares a value obtained by integrating starting current generated on start of the motor M for only predetermined value with the threshold value in the storing unit 10 and, when the integral value is less than the threshold value, notifies of shortage of the power source terminal voltage.

EFFECT OF THE INVENTION

In the present invention, whether operation of the motor M can be continued or not is determined from the minimum value of the power source voltage or the maximum value of the starting current on start of the motor. Consequently, there is no possibility that malfunction occurs in the motor M while tightening the nut 9, obviously in a battery having an insufficient residual quantity and also in a deteriorated battery having a sufficient residual quantity. With a simple configuration which does not require a sensor for measuring the temperature of the battery, means for recording the residual quantity of the battery, and the like, whether the nut 9 can be tightened or not can be accurately notified to the operator.

Similarly, by determining whether the operation of the motor M can be continued or not on the basis of a value obtained by integrating the power source voltage or starting current only for predetermined time, whether the nut 9 can be tightened or not can be accurately notified to the operator.

DETAILED DESCRIPTION OF THE PREFERRED EMBODIMENTS

An embodiment of the present invention will be described in detail hereinbelow with reference to the drawings.

Figure 1:
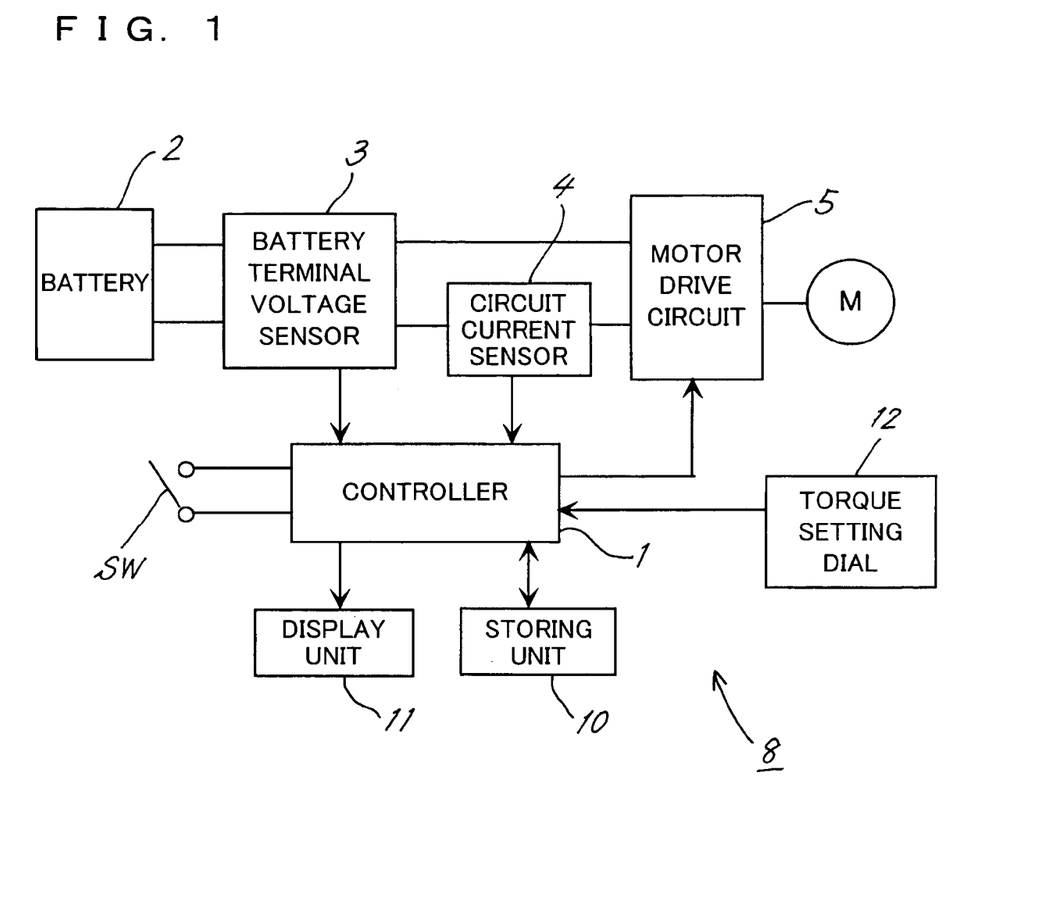
FIG. 1 is an internal block diagram of an electric tightening device according to the present invention.

The embodiment is similar to the conventional technique with respect to the point that the inner socket 6 and the outer socket 7 are provided in the tightening device body 80. FIG. 1 is an internal block diagram of the electric tightening device 8 of the embodiment. The motor M is rotated by a motor drive circuit 5. Between a battery 2 and the motor drive circuit 5, a battery terminal voltage sensor 3 for detecting a terminal voltage of the battery 2 and a circuit current sensor 4 for detecting a circuit current Ic are provided. Signals from the sensors 3 and 4 are input to a controller 1. The controller 1 receives the signals from the sensors 3 and 4 and controls the motor drive circuit 5. To the controller 1, a torque setting dial 12 operated by the operator at the time of setting a tightening torque is connected. When the circuit current Ic reaches a control current value corresponding to a set tightening torque, the controller 1 stops the operation of the motor M.

The controller 1 is connected to a storing unit 10 as a memory in which a threshold value of the battery terminal voltage is stored and a display unit 11 constructed by a group of various lamps. The lamp group is constructed by, concretely, an "operation lamp" indicating that the motor is operating, a "tightening lamp" indicating that the nut 9 is being tightened, a "tightening completion lamp" indicative of completion of tightening of the nut 9, and a "residual quantity shortage lamp" notifying of shortage in the battery residual quantity.

Figure 2:
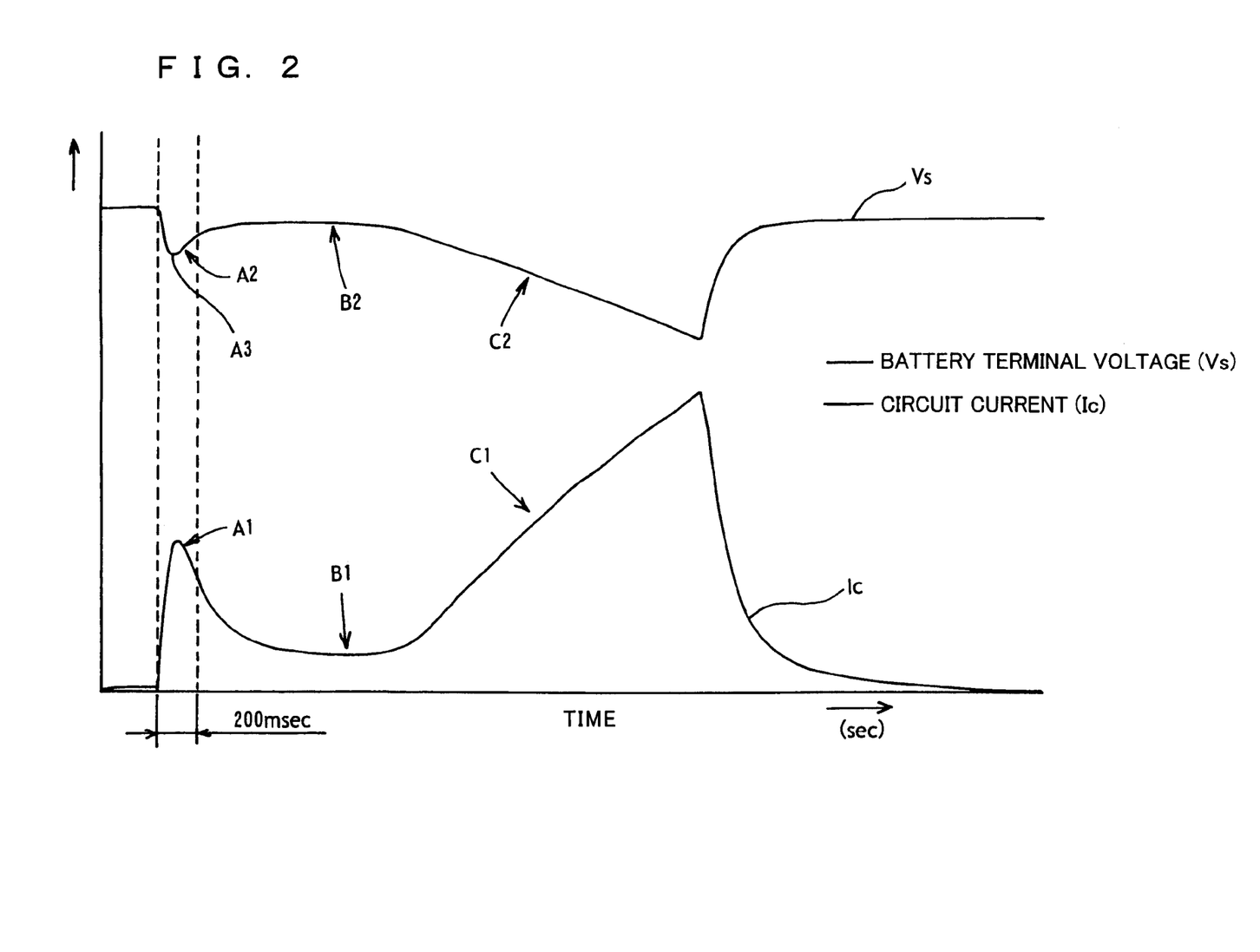
FIG. 2 is a graph in which the vertical axis shows a battery terminal voltage Vs and a circuit current Ic and the horizontal axis indicates lapsed time.

FIG. 2 is a graph whose vertical axis indicates the battery terminal voltage Vs detected by the battery terminal voltage sensor 3 and the circuit current Ic detected by the circuit current sensor 4 and whose horizontal axis indicates elapsed time, and showing changes in the battery terminal voltage Vs and the circuit current Ic when normal tightening operation is performed. First, when the switch SW is turned on to start the motor M, as shown by a portion A1 in FIG. 2, the circuit current Ic increases due to temporary starting current. With the increase, the battery terminal voltage Vs decreases as shown by a portion A2 and becomes the minimum value as shown by a point A3. At this time, the starting current becomes the maximum value.

The revolution speed (not shown) of the motor M increases with lapse of time of hundreds milliseconds and converges to no-load speed. The circuit current Ic decreases synchronously with convergence of the revolution speed and converges to a current value indicated by a portion B1. In correspondence with the change in the current value, the battery terminal voltage rises and converges to a voltage value indicated by a portion B2.

When the reaction force receiving arm 70 comes into contact with the neighboring nut 9a (refer to FIG. 7) and tightening of the nut 9 to a member 91 as an object of tightening starts, load starts to be applied on the motor M and the circuit current Ic gradually increases as shown by a portion C1 in FIG. 2. With the increase, the battery terminal voltage Vs decreases as shown by a portion C2. The circuit current Ic in the portion C1 is called a load current. The controller 1 monitors the load current by the circuit current sensor 4. When the load current reaches a load current set by the torque setting dial 12, the controller 1 stops operation of the motor M, thereby completing tightening of the nut 9. After completion of the tightening, power supply to the motor M is stopped by the controller 1, the circuit current Ic becomes zero, and the battery terminal voltage Vs is reset to the initial voltage.

In a battery which does not have sufficient residual quantity, the battery terminal voltage Vs before the motor M starts is low. Consequently, even if the motor M is started, the revolution speed of the motor M is not sufficiently raised, so that malfunction occurs in the motor M during operation, and normal tightening cannot be performed.

In a deteriorated battery having sufficient residual quantity, as compared with a less-deteriorated battery, when the circuit current Ic increases, a voltage drop in the battery terminal voltage Vs is larger. Therefore, in the deteriorated battery, although the battery terminal voltage Vs before the motor M is started is a voltage which can start the motor M, when the nut 9 is tightened and a load increases, the battery terminal voltage Vs largely drops, and malfunction occurs in the motor M during operation. It is consequently impossible to perform normal tightening.

[First Embodiment]

Figure 3:
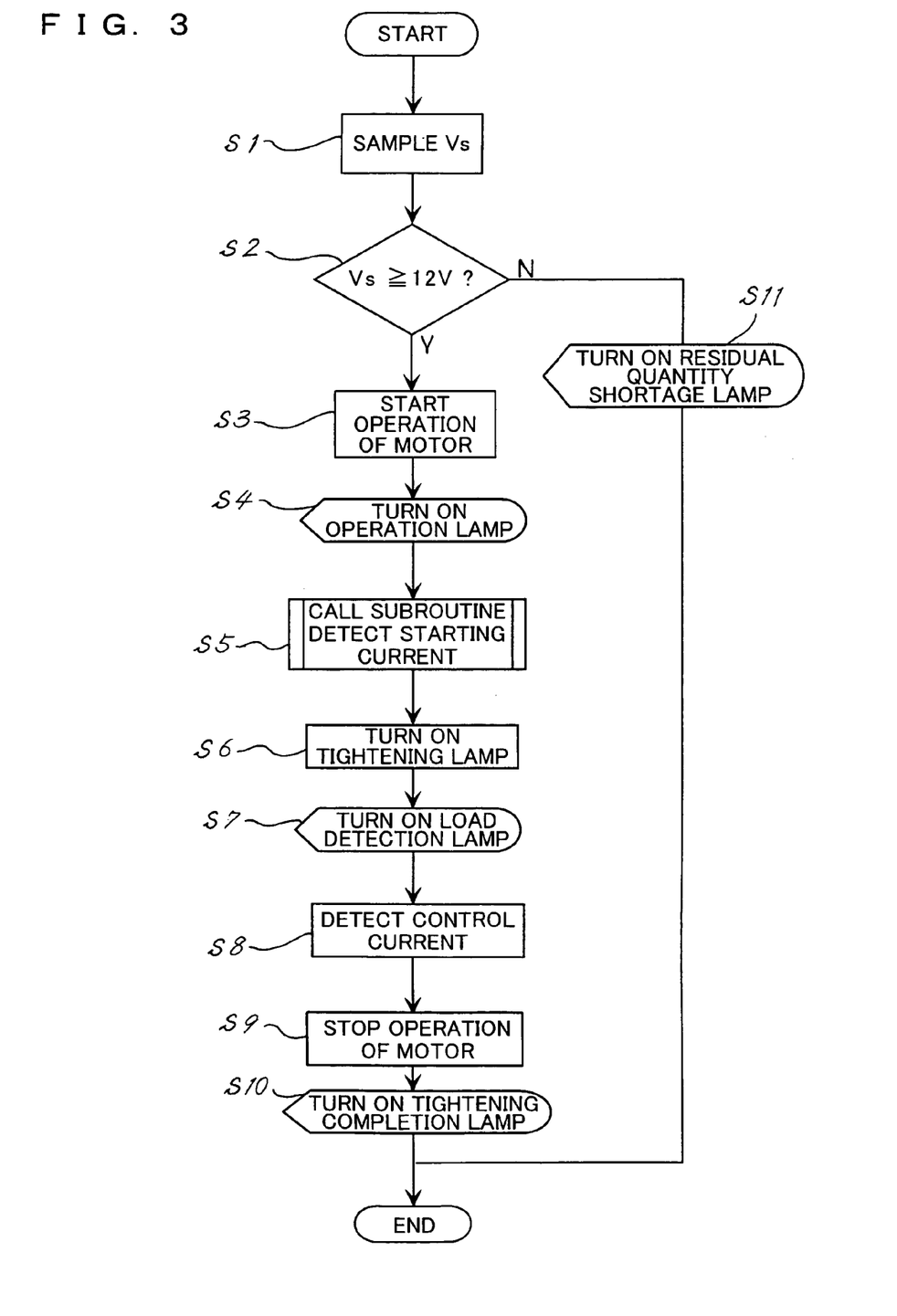
FIG. 3 is a flowchart showing operation of a first embodiment of the electric tightening device.

In a first embodiment, a conventional detecting method of detecting and determining an initial battery terminal voltage before the motor M starts and a battery terminal voltage detecting method according to the invention are combined. FIG. 3 shows a control flowchart of an electric tightening device. In the following description, the motor M can start when the battery terminal voltage Vs is 12 V or higher as a first threshold value and, further, tightening can be performed at 10 V or higher as a second threshold value. The first and second thresholds are not limited to the values.

As shown in the flowchart of FIG. 3, first, the nut 9 is fit in the inner socket 6, and the power source is turned on by operating the switch SW. The controller 1 samples the battery terminal voltage Vs before the motor M is energized and started via the battery terminal voltage sensor 3 (S1) and compares the battery terminal voltage Vs with the first threshold value 12V stored in the storing unit 10 (S2). When the value from the battery terminal voltage sensor 3 is less than the first threshold value, the controller 1 determines that the motor M cannot be started, turns on the "residual quantity shortage lamp" in the display unit 11 (S11), and finishes the control without passing current to the motor M.

Figure 4:
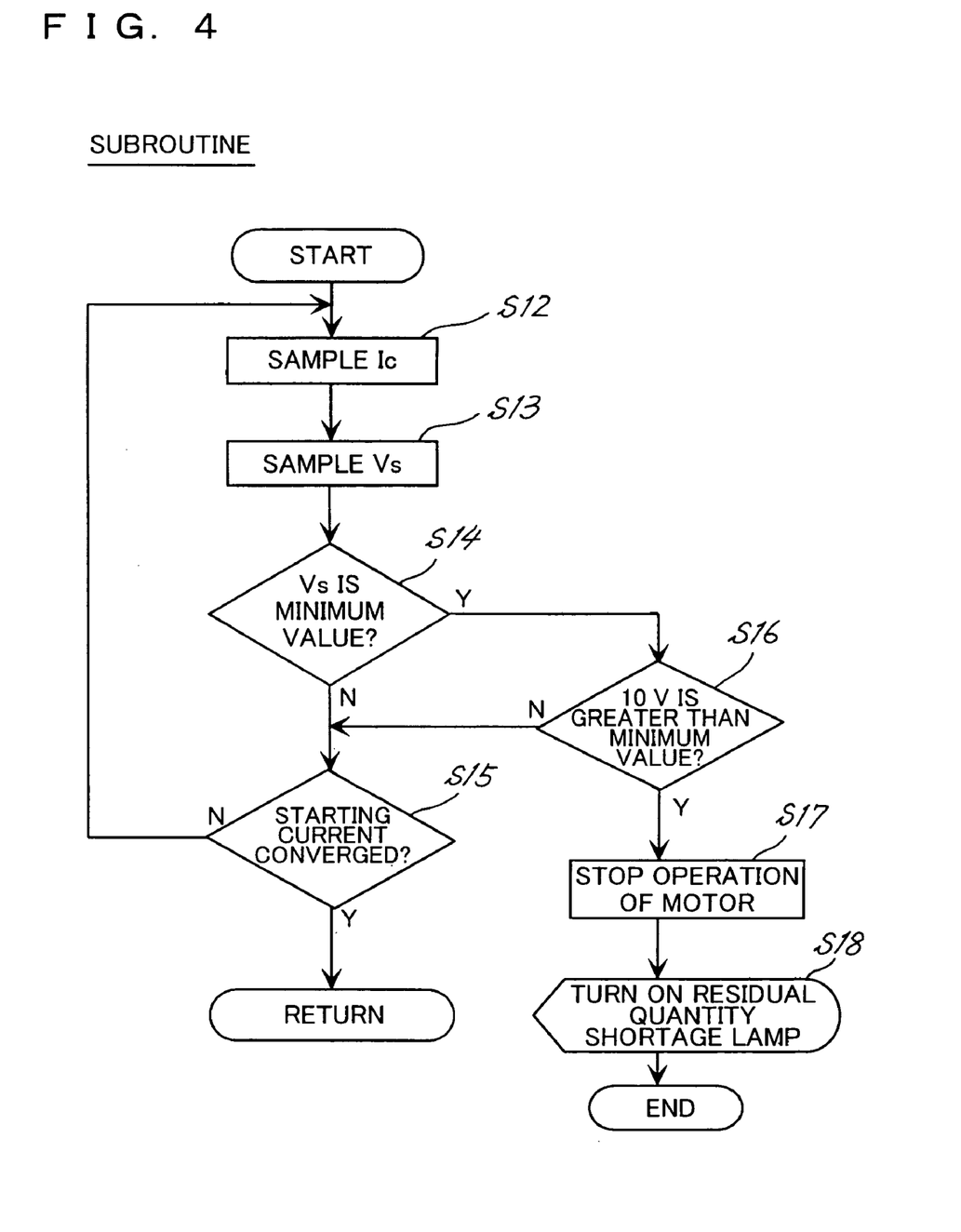
FIG. 4 is a flowchart showing a subroutine of the flowchart of FIG. 3.

When the value from the battery terminal voltage sensor 3 is equal to or larger than the first threshold value and the motor M can start, the controller 1 starts passing current to the motor M (S3), turns on the "operation lamp" (S4), performs operation based on the subroutine of FIG. 4 (S5), and detects starting current generated immediately after the motor M starts.

In the subroutine of FIG. 4, the controller 1 samples the circuit current Ic values (S12) and determines whether the starting current has converged or not (S15). The controller 1 samples the battery terminal voltage Vs values while the starting current converges (S13). When the battery terminal voltage Vs rises after the point A3 and the controller 1 detects that the point A3 is the minimum value (S14), the controller 1 compares the voltage at the point A3 with 10 V as the second threshold value stored in the storing unit 10

(S16). When the voltage at the point A3 as the minimum value is less than the second threshold value, the controller 1 determines that normal tightening is impossible, stops passage of current to the motor M (S17), turns on the "residual quantity shortage lamp" in the display unit 11 (S18), and finishes the control.

When the voltage at the point A3 is equal to or larger than the second threshold value, the controller 1 determines that normal tightening can be performed, confirms convergence of the starting current, and returns to step S5. When the controller 1 monitors the circuit current Ic and detects the load current accompanying the tightening of the nut 9 (S6), the controller 1 turns on the "tightening lamp" (S7). When the value of the load current becomes a control current value corresponding to the set tightening torque (S8), the controller 1 stops operation of the motor M (S9), turns on the "tightening completion lamp" (S10), and completes the tightening of the nut 9.

In this embodiment, whether the operation of the motor M can be continued or not is determined from the minimum value of the battery terminal voltage Vs in the process of generating the starting current immediately after start of the motor M. Consequently, there is no possibility that malfunction occurs in the motor M during the operation of the motor M obviously in a battery having an insufficient residual quantity and also in a deteriorated battery having a sufficient residual quantity. With a simple configuration which does not require a sensor for measuring the temperature of the battery, means for recording the residual quantity of the battery, and the like, whether the nut 9 can be tightened or not can be accurately notified to the operator, and the motor M can be stopped in advance.

In the above description, the starting current of the motor M is detected, the minimum value of the battery terminal voltage Vs accompanying generation of the starting current is obtained, the minimum value is compared with the threshold value in the storing unit 10, and whether the operation of the motor M can be continued or not is determined.

Alternately, it is also possible to detect only the battery terminal voltage Vs without detecting the starting current of the motor M, obtain the minimum value of the battery terminal voltage Vs, and compare the minimum value with the threshold value in the storing unit 10, thereby determining whether the operation of the motor M can be continued or not. That is, when the minimum value is less than the threshold value, it is determined that the operation of the motor M cannot be continued. When the minimum value is equal to or larger than the threshold value, the operation of the motor M is continued.

The threshold value of the starting current is pre-stored in the storing unit 10. It is also possible to detect the battery terminal voltage Vs, obtain the minimum value of the battery terminal voltage Vs when the motor M is started, obtain the maximum value of the starting current when the voltage minimum value is detected, and compare the current maximum value with the threshold value, thereby determining whether the operation of the motor M can be continued or not. That is, when the current maximum value is less than the threshold value, it is determined that the operation of the motor M cannot be continued. When the current maximum value is equal to or larger than the threshold value, the operation of the motor M is continued.

Further, the threshold value of the starting current is pre-stored in the storing unit 10. It is also possible to detect only the starting current, obtain the maximum value of the starting current, and compare the maximum value with the threshold value in the storing unit 10, thereby determining whether the operation of the motor M can be continued or not.

[Second Embodiment]

In a second embodiment, on the basis of a value obtained by integrating the battery terminal voltage only for predetermined time in place of the decrease amount of the battery terminal voltage upon start of the motor, whether the operation of the motor M is continued or not is determined. The operation will be described by using the flowcharts of FIGS. 5 and 6. In the storing unit 10, a value obtained by integrating terminal voltages of the power source is stored as a threshold value for the integral value.

Figure 5:
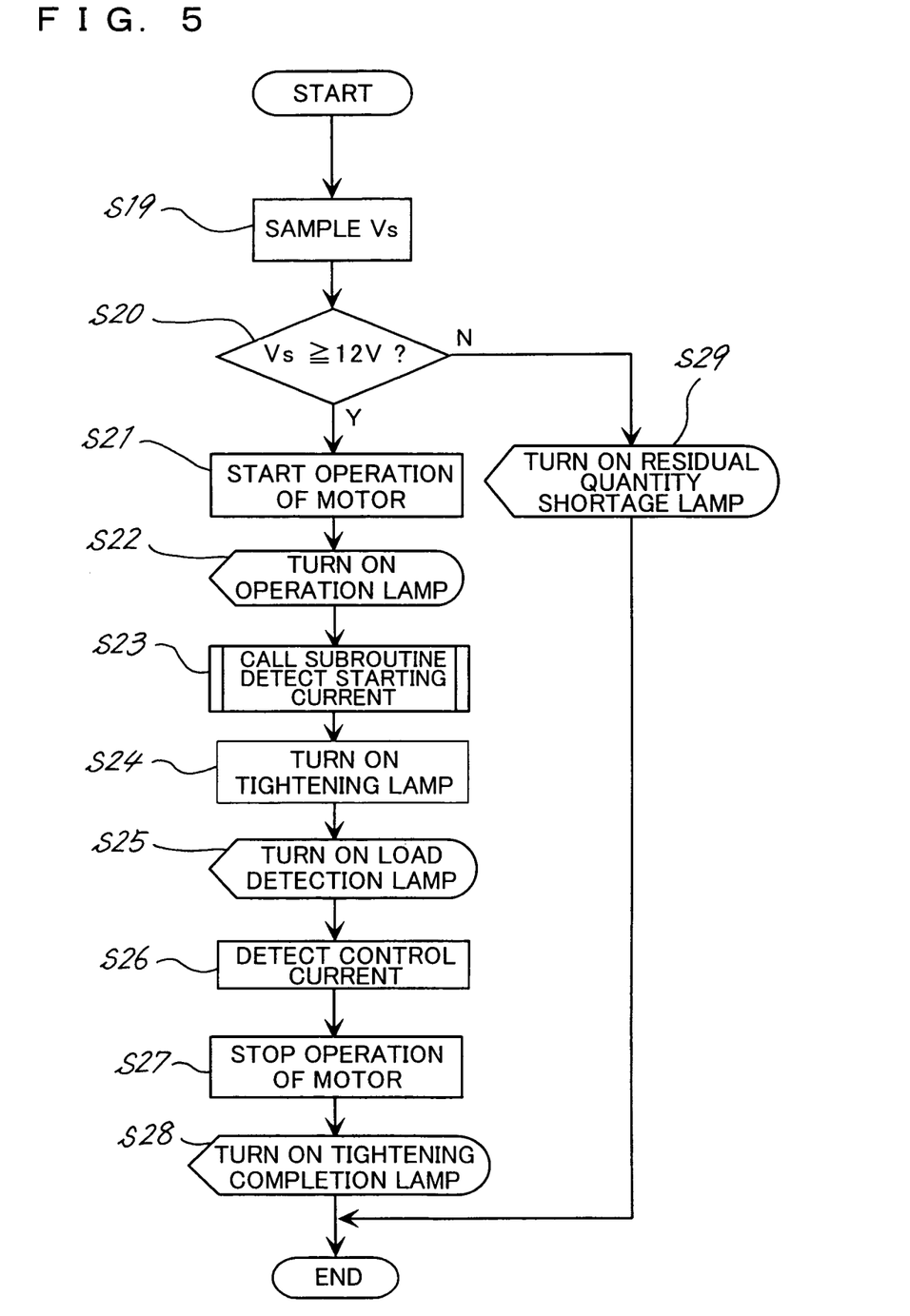
FIG. 5 is a flowchart showing operation of a second embodiment of the electric tightening device.

The general operation in the second embodiment is shown in the flowchart of FIG. 5. The second embodiment is characterized by the subroutine of FIG. 6. Therefore, the operations in steps S19 to S22 and step S29 in the flowchart of FIG. 5 are the same as those in steps S1 to S4 and step S11 in the flowchart of FIG. 3, so that the detailed description will not be repeated. In the following, the operation performed at the time of detecting the starting current in step S23 will be described by using the subroutine of FIG. 6.

Figure 6:
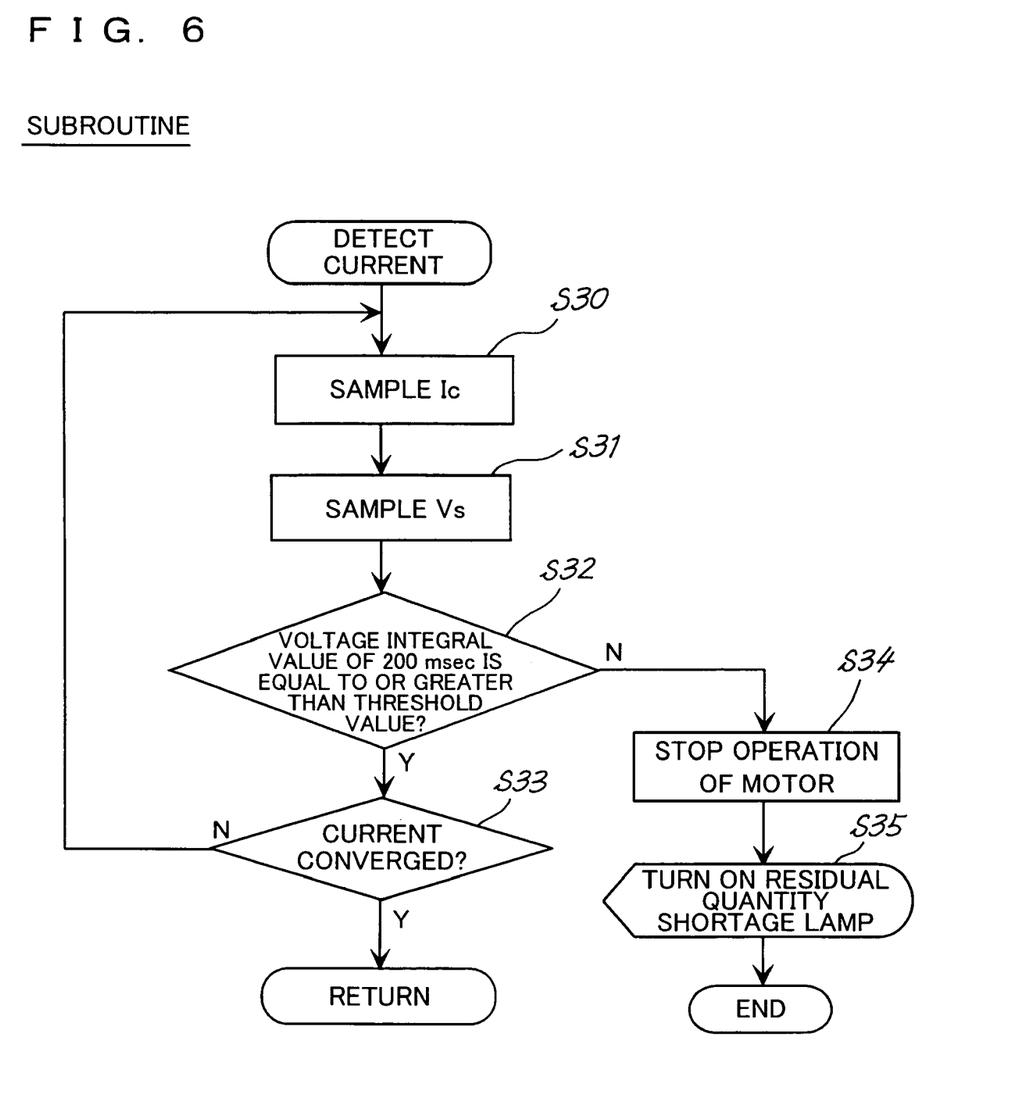
FIG. 6 is a flowchart showing a subroutine of the flowchart of FIG. 5.

In the subroutine of FIG. 6, the controller 1 samples the circuit current Ic values (S30) and determines whether the starting current has converged or not (S33). The controller 1 also samples the battery terminal voltage Vs values during convergence of the starting current (S31). The circuit current Ic and the battery terminal voltage Vs value are sampled every 10 msec.

After sampling the battery terminal voltage Vs value, the controller 1 accumulates the battery terminal voltage Vs values sampled for 200 msec to obtain a voltage integral value, and compares the voltage integral value with the integral threshold value stored in the storing unit 10 (S32).

When the voltage integral value is less than the integral threshold value, the controller 1 determines that normal tightening cannot be performed, stops passage of current to the motor M (S34), turns on the "residual quantity shortage lamp" in the display unit 11 (S35), and finishes the control.

The sampling speed of 10 msec and the integral threshold value of 200 msec are examples and the invention is not limited to the values.

When the integral value is equal to or larger than the integral threshold value, the controller 1 determines that normal tightening can be performed, confirms convergence of starting current (S33), and returns to step S23.

The subsequent operations are shown in steps S24 to S28 in the flowchart of FIG. 5. Since the operations are the same as those in steps S6 to S10 in the flowchart of FIG. 3, the detailed description will not be repeated.

In this embodiment, the operation of the motor M can be continued or not is detected from the value obtained by integrating the battery terminal voltage Vs which decreases in association with the starting current of the motor M. Consequently, there is no possibility that malfunction occurs during operation of the motor M obviously in a battery having an insufficient residual quantity but also in a deteriorated battery having a sufficient residual quantity. With a simple configuration which does not require a sensor for measuring the temperature of the battery, means for recording the residual quantity of the battery, and the like, whether the nut 9 can be tightened or not can be accurately notified to the operator and the motor M can be stopped in advance.

The applicant of the present invention has confirmed that the precision in the case of detecting whether the operation of the motor M can be continued or not from the value obtained by integrating the voltage values is higher than that in the case of determining whether the operation of the motor M can be continued or not from the minimum value of the battery terminal voltage upon start of the motor.

In the foregoing embodiment, whether the operation of the motor M can be continued or not is detected by comparing the value obtained by integrating the battery terminal voltage Vs which decreases in association with the starting current of the motor M for only predetermined time with the integral threshold value. Alternately, it is also possible to pre-store an integral threshold value obtained by integrating the starting current in the storing unit 10 and compare a value obtained by integrating the starting current which rises with decrease in the battery terminal voltage Vs for only predetermined time with the integral threshold value, thereby detecting whether the operation of the motor M can be continued or not.

That is, if the value obtained by integrating the current values is less than the threshold value, it is determined that the operation of the motor M cannot be continued. If the integral value is equal to or larger than the threshold value, the operation of the motor M is continued.

The battery may be a primary battery or a secondary battery. Although a lamp is used to notify the operator that the residual quantity of the battery is insufficient, such as a buzzer may be also used.

What is claimed is:

1. An electric tightening device comprising: a power source that passes current to a motor;

a current detector that detects current flowing in the motor;

a storing unit in which a threshold value of the starting current is stored; and a controller connected to the current detector and the storing unit, wherein the controller detects a maximum value of the starting current generated upon start of the motor by the current detector, compares the current maximum value with the threshold value in the storing unit and, when the current maximum value is less than the threshold value, notifies of shortage of the power source terminal voltage.

2. An electric tightening device comprising: a power source that passes current to a motor;

a current detector that detects current flowing in the motor;

a storing unit in which a threshold value of a value obtained by integrating the current flowing in the motor is stored; and a controller connected to the current detector and the storing unit, wherein the controller integrates the starting current generated upon start of the motor for only predetermined time, compares the integral current value with the threshold value in the storing unit and, when the integral value is less than the threshold value, notifies of shortage of the power source terminal voltage.

* * * * *